United States Patent [19]

Tsukagoshi et al.

[11] Patent Number: 4,740,657
[45] Date of Patent: Apr. 26, 1988

[54] ANISOTROPIC-ELECTROCONDUCTIVE ADHESIVE COMPOSITION, METHOD FOR CONNECTING CIRCUITS USING THE SAME, AND CONNECTED CIRCUIT STRUCTURE THUS OBTAINED

[75] Inventors: Isao Tsukagoshi, Shimodate; Yutaka Yamaguchi, Yuki; Atsuo Nakajima, Ibaraki; Yoshikatsu Mikami, Shimodate; Kuniteru Muto, Shimodate; Yoshiyuki Ikezoe, Yuki, all of Japan

[73] Assignee: Hitachi, Chemical Company, Ltd, Japan

[21] Appl. No.: 13,904

[22] Filed: Feb. 12, 1987

[30] Foreign Application Priority Data

Feb. 14, 1986 [JP] Japan .................. 61-31088
Mar. 6, 1986 [JP] Japan .................. 61-49465

[51] Int. Cl.⁴ .............. H01R 4/04; H01R 43/00; H01B 1/16
[52] U.S. Cl. ................... 174/88 R; 29/868; 174/84 R; 174/94 R
[58] Field of Search ............ 174/84 R, 88 R, 94 R; 29/868; 252/512, 513, 514

[56] References Cited

U.S. PATENT DOCUMENTS

| | | | |
|---|---|---|---|
| 4,003,621 | 1/1977 | Lamp | 339/DIG. 3 X |
| 4,113,981 | 9/1978 | Fujita et al. | 174/88 R |
| 4,356,505 | 10/1982 | Lovinger et al. | 252/512 X |
| 4,401,843 | 8/1983 | Harper et al. | 174/72 B |
| 4,425,263 | 1/1984 | Nazarenko | 252/513 X |
| 4,433,887 | 2/1984 | Sado et al. | 174/88 R X |
| 4,450,188 | 5/1984 | Kawasumi | 252/514 X |
| 4,496,475 | 1/1985 | Abrams | 252/514 |
| 4,568,592 | 2/1986 | Kawaguchi et al. | 252/514 X |
| 4,595,604 | 6/1986 | Martin et al. | 252/514 X |
| 4,624,801 | 11/1986 | Kawaguchi et al. | 252/514 X |
| 4,642,421 | 2/1987 | Dery et al. | 174/88 R |
| 4,659,872 | 4/1987 | Dery et al. | 174/117 FF X |

FOREIGN PATENT DOCUMENTS

| | | |
|---|---|---|
| 0140619 | 5/1985 | European Pat. Off. |
| 111366 | 7/1982 | Japan .................. 252/514 |
| 8402423 | 6/1984 | World Int. Prop. O. |
| 8504980 | 11/1985 | World Int. Prop. O. |

OTHER PUBLICATIONS

Central Patent Index-Basic Abstracts Journal, Section A, An=85187 230 Derwent Publications, London, GB; JP-A-60 115 678 (Matsushita Elec. Ind. K.K.) 22-06-1985.

*Primary Examiner*—Morris H. Nimmo
*Attorney, Agent, or Firm*—Antonelli, Terry & Wands

[57] ABSTRACT

Excellent connection of conductors with high reliability can be accomplished by using an adhesive composition or flim capable of exhibiting anisotropic-electroconductivity comprising electroconductive particles comprising polymeric core materials coated with thin metal layers, and electrically insulating adhesive component.

25 Claims, 2 Drawing Sheets

ANISOTROPIC-ELECTROCONDUCTIVE ADHESIVE COMPOSITION, METHOD FOR CONNECTING CIRCUITS USING THE SAME, AND CONNECTED CIRCUIT STRUCTURE THUS OBTAINED

BACKGROUND OF THE INVENTION

This invention relates to an anisotropic-electroconductive adhesive composition for connecting circuits, an adhesive film made from such an adhesive composition, a method for connecting circuits by using these adhesive materials, and a connected circuit structure thus obtained.

As methods for connecting conductors arranged with very fine pitches such as connection of integrated circuits with wiring substrates, connection of display elements with wiring substrates, connection of electric circuits with leads, etc., there have widely been used a soldering method, and a method of using connecting materials such as an electroconductive adhesive, and the like. But, since the connecting materials should be formed on only electroconductive portions in these methods, the connection was very difficult in the case of fine circuits with higher density and higher fineness and sometimes adjacent conductors were undesirably connected with such connecting materials.

Recently, connecting materials for connecting conductors have been studied and disclosed in, for example, Japanese patent unexamined publication No. 55-104007 and U.S. Pat. No. 4,113,981, etc. Basic ideas of these publications reside in a process for using a so-called anisotropic-electroconductive connecting material wherein a layer of anisotropic-electroconductive connecting material including an electroconductive material such as metal particles is formed between conductors standing opposite to each other, electrical connection between the conductors and electrical insulating properties between adjacent conductors are simultaneously provided by applying pressure alone or pressure with heating, and the conductors standing opposite to each other are bonded and fixed.

But in these methods, since the electrical conduction between the conductors was obtained mainly by contact of a plurality of electroconductive materials such as metal particles in many cases, the contact areas between particles or between a particle and a conductor surface was insufficient due to rigidity of the metal particles and the reliability of conduction was insufficient.

On the other hand, in order to improve the initial connection reliability or to reduce the production cost using the same idea for electrical conduction as mentioned above, there have been proposed methods for obtaining anisotropic-electroconductive connection by using particles having electroconductive layers on the surfaces of electroconductive particles or insulating particles which were used as core materials (e.g. Japanese patent unexamined publication Nos. 56-122193, and 58-111202). But when metal particles, alumina, glass and the like were used as the core material, the contact areas between particles or a particle and a conductor surface were insufficient due to the rigidity of core materials and thus the reliability of conduction was unsatisfactory.

The above-mentioned prior art techniques make it possible to obtain anisotropic electroconductivity at the time of conductor connection, but cannot provide reliability at the connected portion for practical use. This is shown by Comparative Examples 1 to 4 in Table 1 mentioned below.

In order to improve the connection reliability, EP 147856, for example, proposes a process for connecting conductors by melting metal particles dispersed in an insulating adhesive between the conductors. But since the metal particles are melted with heating, the range for connecting conditions is narrow and thus there is a defect in that the reliability at the time of connection is unsatisfactory. That is, even if good connection can be obtained at near the melting point of a metal, but there is a defect in that metal particles flow and are deformed by melting at a temperature higher than the melting point like the conventional soldering to connect adjacent conductors, resulting in lose of insulating properties between adjacent conductors (being called "leak") and a lack of ability to be used for fine conductor pitches. Further, since the melting of the metal does not take place at a temperature lower than the melting point of the metal, the rigid metal particles are only present between conductors as mentioned above, thereby making it possible to obtain initial electroconductivity but, thereby making it unsatisfactory to obtain long connection reliability, particularly reliability, for example, in a thermal shock test. Further, it is difficult to control a melting state even at near the melting point from the viewpoint of thermal conductivity and the like. Even if good conductor connecting portions are obtained, since the difference in thermal expansion between an adhesive and the metal particles is large, there is a defect in that the thermal shock resistance is low as mentioned above.

In conductor connection for displays, one of major application fields of these anisotropic-electroconductive connecting materials, there have often been used transparent electroconductive films forming electroconductive circuits with thin layers of metal oxides such as tin oxides, indium oxide, titanium oxide, or aluminum, chromium, or the like on transparent substrates made from glass, plastics, and the like. But heat melting metal particles such as solder have poor wettability for conductor surfaces because of their extremely large surface tension and do not alloy an oxidation surface of aluminum or the like or oxide circuit, so that there are defects in that the wettability with the conductor surfaces is insufficient, and a changing rate of resistance to temperature change at connecting portions is large.

Thus, in the use for display devices such as liquid crystal display devices (LCD), electroluminescence (EL) plasma or fluorescence display tubes, there are problems for practical uses in that display at high temperatures becomes unclear, or the display becomes impossible. In order to improve such problems, a thin layer of Au or Ni is formed on the transparent electroconductive film by plating or sputtering so as to increase the surface tension of the conductors. But such a method requires complicated steps and higher treating techniques, so that the production cost of products is undesirably raised.

SUMMARY OF THE INVENTION

This invention provides an anisotropic-electroconductive adhesive composition capable of forming connections with high reliability at the time of or after circuit connection overcoming the defects of the prior art, an adhesive film obtained from said adhesive composition, a method for connecting conductors by using these adhesive materials, and a connected conductor structure thus produced and having a low resistance temperature coefficient at the conductor connecting portions.

This invention provides an adhesive composition for connecting conductors and capable of exhibiting anisotropic-electroconductivity by applying pressure comprising 0.1 to 15% by volume of electroconductive particles and 99.9 to 85% by volume of an electrically insulating adhesive component, each electroconductive particle comprising a polymeric material as a core material and an electrically conductive thin metallic or metal layer coated on almost whole surface of said core material, preferably with an aspect ratio of 0.05 to 1.0 and an average particle size diameter of 0.5 to 300 μm, a ratio of the thermal expansion coefficient of the adhesive component to that of the core material being 0.5/1 to 10/1, and a ratio of the modulus of elasticity in tension of the adhesive component to that of the core material being 1.2/1 to 0.01/1.

This invention further provides an adhesive film for connecting conductors and capable of exhibiting anisotropic-electroconductivity by applying pressure alone or pressure and heating comprising 0.1 to 15% by volume of electroconductive particles and 99.9 to 85% by volume of electrically insulating adhesive component, each electroconductive particle comprising a polymeric material as a core material and an electrically conductive thin metallic layer coated on almost whole surface of said core material, preferably with an aspect ratio of 0.05 to 1.0 and an average particle size diameter of 0.5 to 300 μm, the ratio of the thermal expansion coefficient of the adhesive component to that of the core material being 0.5/1 to 10/1, and the ratio of the modulus of elasticity in tension of the adhesive component to that of the core material being 1.2/1 to 0.01/1.

This invention still further provides a method for connecting conductors which comprises interposing an adhesive composition or an adhesive film capable of exhibiting anisotropic-electroconductivity by applying pressure or pressure and heating comprising 0.1 to 15% by volume of electroconductive particles, each electroconductive particle comprising a polymeric material as a core material, and an electrically conductive metallic thin layer coated on almost whole surface of said core material, said electroconductive particles being dispersed in 99.9 to 85% by volume of a [heat sensitive, pressure sensitive, thermosetting and/or photocurable] adhesive component, between electrode conductors standing opposite to each other, and pressing alone, i.e. without heating or pressing with heating said circuits so as to make the thickness of the adhesive layer between the circuits in the range of 0.02 to 0.95 of the initial thickness so as to provide electrical connection and mechanical bonding between the circuits.

This invention also provides a connected conductor structure comprising conductors standing opposite to each other and connecting materials connecting said conductors electrically, said connecting materials comprising 0.1 to 15% by volume of electroconductive particles and 99.9 to 85% by volume of an electrically insulating adhesive component, each electroconductive particle comprising a polymeric material as a core material and an electrically conductive thin metallic layer coated on almost whole surface of said core material, and said electroconductive particles being fixed between the conductors standing opposite to each other in a deformed state pressed by the conductors.

DESCRIPTION OF THE PREFERRED EMBODIMENTS

Figure 1:
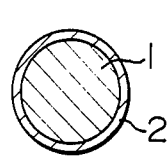
FIGS. 1 and 2 are schematic cross-sectional views of electroconductive particles used in this invention.
Figure 2:
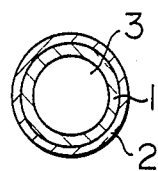

The adhesive composition and the adhesive film of this invention are explained referring to drawings. FIGS. 1 and 2 are schematic cross-sectional views of the electroconductive particles used in this invention. In FIG. 1, the surface of a polymeric core material 1 is coated with a thin metal layer 2. In FIG. 2, the polymeric core material 1 has a hollow portion 3.

The polymeric core materials having structures shown by FIG. 1 and FIG. 2 are used alone or as a mixture thereof.

The core material can take any forms of a fully filled body, a hollow body containing a gas such as air therein, a foamed body having cell portions therein, and the like.

The shape of the polymeric core material 1 is typically a sphere or sphere-like form and having plastic deformation properties by applying pressure or pressure and heating. The polymeric core material may have projections or roughness on the surface, or can be used as agglomerated particles of core material particles.

The term "polymeric" of the polymeric core material means plastics, rubbers, naturally occurring high polymers, a mixture thereof as composites of these materials or copolymers. These polymeric materials may contain one or more crosslinking agents, curing agents and other additives depending on purposes. Examples of polymers used as the polymeric core material are polyethylenes, polypropylenes, polystyrenes, acrylonitriles-tyrene copolymers, acrylonitrile-butadiene-styrene copolymers, polycarbonate, various acrylates such as poly(methyl methacrylate)s, polyvinyl butarals, polyvinyl formals, polyimides, polyamides, polyesters, polyvinyl chlorides, polyvinylidene chlorides, fluorine resins, poly(phenylene oxide)s, poly(phenylene sulfide)s, polymethylpentenes, urea resins, melamine resins, benzoguamine resins, phenol resins, formaline resins, xylene resins, furan resins, diallyl phthalate resins, epoxy resins, polyisocyanate resins, phenoxy resins, silicone resins, etc. These polymeric materials may be modified according to conventional methods. When a thermosetting resin is used as the polymeric core material, the degree of curing is not limited so long as it does not damage the mixing with the adhesive component. These polymers may be used alone or as a mixture thereof.

Further, the selection of these polymers is determined by considering the following points:

(1) To be softened or deformed under a pressure of 100 kg/cm² or less at the temperature of connecting circuits, i.e., from room temperature to 400° C.

(2) To have a thermal expansion coefficient of $20 \times 10^{-5}$ to $2 \times 10^{-5}$ (1/° C.) at near room temperature.

(3) To have a modulus of elasticity (in tension) of almost the same value or higher as that of the adhesive component.

(4) To have good adhesiveness with the coated metal thin layer.

To be softened or deformed under pressure or under pressure with heating at the time of connecting conductors is necessary to increase the contact areas between electroconductive particles mutually or between the electroconductive particles and the conductors at the time of conductor connection. It is possible to use pressure-sensitive connection by means of a so-called pressure-sensitive adhesive at room temperature and to use heat-sensitive connection with heating upto 400° C. in addition to pressing. When the heating temperature is higher than 400° C., there is a fear of giving thermal damages on conductor substrates. Thus, it is not preferable to use the temperature of higher than 400° C. Further, since there often arises a problem of heat stability of connection conductors in the case of at room temperature bonding, it is preferable that the polymeric core material is softened or deformed at 100° to 250° C.

The pressure used for connecting conductors is preferable when it is low so as not to give an adverse affect on the conductor portions. It is preferable to use the pressure of 100 kg/cm² or less, more preferably 50 kg/cm² or less.

The limitation to the thermal expansion coefficient of the polymeric core material is necessary from the viewpoint of adhesiveness to the coated metal thin layer at the time of thermal deformation. When the thermal expansion coefficient is higher than $20 \times 10^{-5}$ (1/° C.), thermal expansion and shrinkage amounts become so large that the thin metallic layer is readily cracked or peeled off.

To have the modulus of elasticity (in tension) of almost the same value or higher as that of the adhesive component is necessary to obtain a suitable connecting state at the time of circuit connection under pressure or under pressure with heating.

The adhesiveness between the metallic thin layer and the polymeric core material can be improved by properly selecting a surface activating method such as a plasma or corona treating method, or a surface treating method using various coupling agents, chelating agents, polarity imparting agents, or the like, on the polymeric core material, in addition to consideration of polarity of the polymeric core material and the above-mentioned thermal expansion coefficient. When the adhesiveness is improved, the peeling of the thin metallic layer can be prevented and at the same time good electroconductivity and insulating properties can be obtained.

As the thin metal used as the metal or metallic layer 2, there can be used various metals, metal oxides and alloys considering the following points:

(1) To be a good electrical conductor preferably having a resistivity of $100 \times 10^{-6}$ Ω-cm or less, more preferably $10 \times 10^{-6}$ Ω-cm.

(2) To have a thermal expansion coefficient of $1.0 \times 10^{-5}$ to $4.0 \times 10^{-5}$ (1/° C.) at near room temperature.

Examples of metal elements satisfying the above-mentioned conditions (1) and (2) are Zn, Al, Sb, U, Cd, Ga, Ca, Au, Ag, Co, Sn, Se, Fe, Cu, Th, Pb, Ni, Pd, Be, Mg, and Mn. These metal elements can be used alone or as a mixture or alloy thereof. It is possible to add one or more other elements or compounds for special purposes such as for improving hardness, surface tension, etc.

The thin metallic layer 2 can be formed on the polymeric core material 1 by a physical chemical method such as a vapor deposition method, a sputtering method, an ion plating method, a plating method, or the like; or a chemical method such as a method wherein a small amount of metal is dispersed in a monomer at the time of synthesizing a polymeric core material and the metal powder is adsorbed on polymer particle surfaces after the polymerization, a method wherein a core material having functional groups and a metal is chemically bonded, a method wherein a metal is adsorbed on the core material by using a surface active agent or coupling agent, or the like.

As the method for plating the polymeric core material, there can be used an electroless plating method conventionally used for forming metal layers. For example, the polymeric core material may be subjected to a surface roughening treatment and a hydrophilic treatment, if necessary, and then to a catalyst such as paladium chloride coating step. Then, the polymeric core material is treated in an electroless plating bath at a predetermined temperature such as 20°–95° C. for a predetermined time such as 5–120 minutes, if necessary with stirring so as to prevent the agglomeration of the core material. The thickness of the plating layer can be controlled by changing the amount of plating solution, plating time, plating temperature, etc.

In the case of nickel plating, a nickel-phosphur system or nickel-boron system can be used as a plating solution and sodium hypophosphite, sodium borohydride, or the like can be used as a reducing agent. In the case of copper plating, a rochelle salt bath, an EDTA (ethylenediaminetetraacetic acid) bath or the like can be used as a plating solution and formaldehyde can be used as a reducing agent.

It is also possible to form a composite metal layer such as a nickel layer + a gold layer, etc. by the plating method. For example, in the case of forming a gold layer over a nickel layer, there can be used either a reduced type or a substituted type gold cyanide system as a plating solution. But the use of the substituted type gold plating method is preferable considering the easiness of handling and obtaining the desired thickness. When a nickel plated article is treated in a gold plating solution at a predetermined temperature for a predetermined time, there can be obtained electroconductive particles having a composite layer of polymeric core material/Ni/Au.

The thickness of the metal thin layer is preferably in the range of 0.01 to 5 μm, more preferably 0.05 to 1 μm, and such a thickness can be included in the range of 1/5 to 1/1000 of the particle size (diameter) of the electroconductive particles. Such a thickness is preferable so as to reduce the dependency on temperature change, since the electroconductivity is lowered when the thickness is small, and the difference in thermal expansion and shrinkage with respect to the polymeric core material and the adhesive component increases when the thickness is large. Further, the metal has sufficient adaptability to deformation due to the thinness of the layer, but it is more preferable to use a metallic material having a large elongation and malleability.

According to a prior art technique, glass spheres (beads) or glass hollow spheres (balloons) coated with a thin layer of Ag, etc. are used as the electroconductive particles. But since these particles cannot be softened and deformed at the time of pressing with heating, they cannot be used in this invention.

The electroconductive particles preferably have an average particle size of 0.5 to 300 μm and an aspect ratio (a ratio of the minimum particle diameter to the maximum particle diameter) of 0.05 to 1.0. When the average particle size (diameter) is less than 0.5 μm, a large amount of the electroconductive particles become necessary, which results in increasing the packing particle number and undesirably lowering the adhesiveness to the conductors. On the other hand, when the average particle size (diameter) is larger than 300 μm, spaces between adjacent conductors are connected so as to leak due to the largeness of the particles, so that such particles cannot be used for connecting fine conductors. In order to prevent the generation of leak, it is necessary to select electroconductive particles having a smaller particle size than the space of conductors to be connected. Considering safety, it is preferable to use electroconductive particles having a maximum particle size of $\frac{1}{2}$ to $\frac{1}{4}$ of the space width of conductors.

The aspect ratio of the electroconductive particles is preferably in the range of 0.05 to 1.0 as mentioned above. When the aspect ratio is outside the above-mentioned range, the particles become too flaky to obtain both the electroconductivity between conductors and insulating properties between adjacent conductors at the same time. Further, there is a strong tendency to lower the adhesiveness to the circuits.

The electroconductive particles with almost sphere in shape can satisfy the above-mentioned range, but not limited thereto so long as satisfying the above-mentioned conditions. Further, the electroconductive particles may have projections and unevenness on the surface thereof, and may be not only single particle but also agglomerated particles.

As the particle size, an average particle size is employed and it is convenient to use a scanning type electron microscope for measuring the shape of particles and the particle size. The average particle size D can be obtained by the following equation:

$$D = \Sigma nd / \Sigma n$$

wherein n is the number of particles having a particle size (diameter) of d.

When the electroconductive particles are spheres, it is easy to obtain contact of the particles mutually or the particles with conductor surface so as to easily obtain high electroconductivity.

Figure 9:
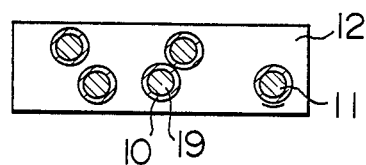
FIG. 9 is a schematic cross-sectional view of a connecting material used in this invention.

The electroconductive particles may be present in a single layer at the thickness direction of the connecting material or present in an arrangement of a plurality of particles or in an agglomerated structure. FIG. 9 is a schematic cross-sectional view of a connecting material used in this invention. In FIG. 9, numeral 11 denotes an electroconductive particle, numeral 12 an insulating adhesive component, numeral 19 a polymeric core material and numeral 20 a metal thin layer.

The content of the electroconductive particles in the adhesive component is 0.1 to 15% by volume. When the content is less than 0.1% by volume, satisfactory electroconductivity cannot be obtained, while when the content is more than 15% by volume, insulating properties with respect to adjacent conductors are lowered due to an increase of chance for contacting with other particles at the width direction, and transparency of the adhesive film is worsened. More preferable range is 0.5 to 10% by volume considering the above-mentioned reasons.

As the adhesive component, there can be used heat sensitive, pressure sensitive, thermosetting and/or photocurable adhesives having insulating properties and being used in conventional adhesive sheets. The adhesive component preferably has a thermal expansion coefficient of $5 \times 10^{-4}$ (1/° C.) or less. Conventional adhesive sheets comprise a polymer which imparts cohesive force and, if necessary, one or more tackifiers, tackiness regulators, crosslinking agents, anti-aging agents, dispersing agents, etc.

As the polymer, there can be used ethylene-vinyl acetate copolymers, ethylene-vinyl acetate copolymer modifiers, polyethylenes, ethylene-propylene copolymers, ethylene-acrylic acid copolymers, ethylene-acrylic acid ester copolymers, ethylene-acrylate copolymers, acrylic acid ester rubbers, polyisobutylene, atactic polypropylene, polyvinyl butyrals, acrylonitrile-butadiene copolymers, styrene-butadiene block copolymers, styrene-isoprene block copolymers, polybutadienes, ethyl cellulose, phenoxy resins, polyesters, epoxy resins, polyamides, polyurethanes, natural rubber, synthetic rubbers such as silicone rubbers, and polychloroprenes, polyvinyl ethers, etc. These polymers can be used alone or as a mixture thereof.

As the tackifier, there can be used cyclopentadiene resins, rosin, modified rosins, terpene resins, xylene resins, terpene-phenol resins, alkylphenol resins, coumaron-indene resins, etc., alone or as a mixture thereof, depending on purposes. As the tackiness regulator, there can be used various plasticizers such as dioctyl phthalate, etc.

The crosslinking agent is used for enhancing the cohesive force of the polymer. It is a polyfunctional substance which can react with functional groups of the polymer. Examples of the crosslinking agent are polyisocyanates, melamine resins, urea resins, phenol resins, amines, acid anhydrides, peroxides, etc. In the case of photocurable polymer, there can be used benzophenone, benzoquinone, etc. as a photosensitizer.

The anti-aging agent is used when it is necessary to enhance the stability for heat of polymer binder, oxygen, light, and the like. Examples of the anti-aging agent are stabilizers such as metallic soaps, anti-oxidants such as alkylphenols, ultraviolet absorbing agents such as benzophenones, benzotriazoles, etc. These anti-aging agents may be used alone or as a mixture thereof depending on purposes.

The dispersing agent is sometimes used for improving dispersing properties of electroconductive particles. Examples of the dispersing agent are surface active agents of nonionic series, cationic series, anionic series, and ampholytic series. These surface active agents can be used alone or as a mixture thereof.

It is preferable that the ratio of thermal expansion coefficient of the adhesive component to that of the polymeric core material is 0.5/1 to 15/1 and the ratio of modulus of elasticity of the adhesive component to that of the polymeric core material is 1.2/1 to 0.01/1. The thermal expansion coefficient means a linear expansion coefficient at near room temperature and the modulus of elasticity means a modulus of elasticity in tension.

The above-mentioned ranges are necessary from the viewpoint of connection reliability and long period reliability of the circuit connecting portions. When the thermal expansion coefficient is outside the above-mentioned range, difference in thermal expansion shrinkage between the polymeric core material and the adhesive component becomes large, the electroconductive particles do not follow the expansion of conductors due to thermal expansion of the adhesive component, resulting in generating undesirably bad contact between the electroconductive particles and the conductors. More preferable range is 0.6 to 9 from the same reasons as mentioned above. On the other hand, it is necessary to improve the reliability at the time of conductor connection by making the ratio of modulus of elasticity of the polymeric core material almost the same or more as that of the adhesive component. When the ratio is less than 0.01, the contact of electroconductive particles mutually or electroconductive particles with the conductors easily becomes a point contact which is an insufficient contact at the time of conductor connection due to too high modulus of elasticity of the polymeric core material, which results in producing unsatisfactory electroconductivity. On the other hand, when the ratio is more than 1.2, the deformation and flow of the polymeric core material easily take place compared with the adhesive component, so that insulating properties between adjacent conductors cannot be maintained so as to cause leak and cannot be applied to fine conductors. Further, the width of conditions at the time of connection become narrower. More preferable range is 1.0 to 0.02 from the same reasons as mentioned above.

The adhesive composition of this invention can be produced by dissolving the adhesive component comprising a polymer and if necessary one or more additives in a solvent, or dispersing the adhesive component in a medium in a suspended state, or heat melting the adhesive component to give a liquid state, and mixing the electroconductive particles with the liquid adhesive component by a conventional dispersing method using a ball mill, a stirring apparatus, or the like.

As to the use of a solvent, since the electroconductive particles having the thin metallic layer on the polymeric core material have little solubity in a solvent, it is possible to use a solvent. It is more preferable to select a solvent which can dissolve the adhesive component but does not dissolve the polymeric core material. Examples of such a solvent are toluene, methyl ethyl ketone, dioxane, ethyl acetate, etc. It is also a good method wherein the adhesive is emulsified and then the electroconductive particles are dispersed in an aqueous medium.

The adhesive composition containing the electroconductive particles can be coated directly on one or both conductors to be connected by means of screen printing or using a roll coater to form adhesive layers, or can be formed into a film-like continuous long sheet. The adhesive film in the form of continuous long sheet can be produced by forming a connecting material layer on a separator made of paper or plastic film treated with release treatment depending on necessity by means of screen printing or using a roll coater, followed by continuous wind-up. When the adhesive layer has no stickiness, it is possible to wind up the adhesive film without using the separator. Further, it is possible to use a core material such as non-woven fabric for reinforcing the adhesive.

When a solvent or a dispersing medium is contained in the adhesive composition in the production process mentioned above, it is possible to obtain an adhesive film wherein the electroconductive particles have denser arrangement at the thickness direction by applying a volume shrinkage phenomenon at the thickness direction at the time of drying the solvent. On the other hand, in a hot melt coating process in the absence of a solvent, it is possible to prevent environmental pollution due to a solvent at the time of production.

The thickness of the adhesive film can be determined considering the particle size of electroconductive particles and properties of connecting material. Preferable thickness is 1 to 300 $\mu$m. When the thickness is less than 1 $\mu$m, sufficient adhesiveness cannot be obtained, while when the thickness is more than 300 $\mu$m, a larger amount of electroconductive particles are necessary in order to obtain sufficient electroconductivity; this is not preferable from the viewpoint of practical use. More preferable thickness is 3 to 100 $\mu$m by the same reasons as mentioned above.

The thus obtained adhesive film has considerable transparency. When the adhesive film has transparency, quality control during the production is easy and the adhesive film has good surface appearance. Further, in the case of adhesion of display elements, it is possible to take a structure wherein an adhernd can be seen through.

Connection of conductors can be carried out by preliminarily adhering the adhesive film to conductors, and if a separator is present, the separator is peeled off, or coating the adhesive composition on conductors, and if necessary removing a solvent, and then placing another conductors to be connected on the adhesive tape or adhesive composition, followed by bonding by a heat press, a heat roll, or the like.

Figure 3:
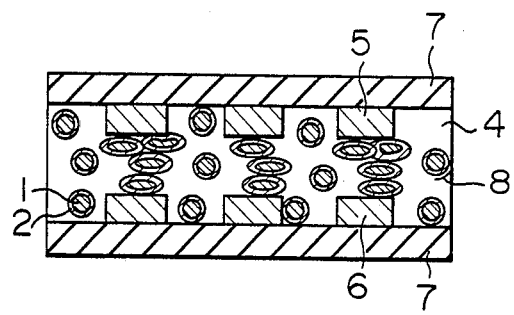
FIGS. 3 and 4 are schematic cross-sectional views showing a connected state of conductors by using the adhesive film of this invention.
Figure 4:
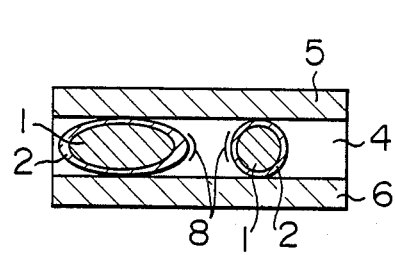

FIGS. 3 and 4 are schematic cross-sectional views showing a connected state of conductors by using the adhesive film of this invention. Since the adhesive 4 is softened and flowed by the heat and pressure and at the same time the electroconductive particles 8 are softened and flowed to contact mutually, electroconductive adhesion between the conductors 5 and 6 becomes possible. In FIG. 3, numeral 7 denotes an insulating substrate.

FIG. 3 shows an example wherein electroconductive particles 8 are present in double or more layers between conductors 5 and 6. Such a structure can give high electroconductivity, since the metal layers on the particle surfaces contact each other to form electroconductive paths.

At the time of connection with heating and pressing, the coating metal layer is so thin that it can sufficiently follow the deformation of the polymeric core material. Even if it cannot follow the deformation of the polymeric core material and defects such as cracks may be formed on the coating metal thin layer, the electroconductive path can be maintained by contact with conductors or other particles.

In order to obtain the most suitable connecting state, it is necessary to make the ratio $t/T = 0.02$ to 0.95, wherein T is the thickness of the adhesive composition (or film) before the connection and t is the thickness between the conductors after connected. In this case, when the electroconductive particles having a particle size of D are present in a single particle state along the thickness direction before the connection, the ratio of d/D, wherein d is the particle size after connection, can be used in place of the ratio of t/T.

When the ratio of t/T is less than 0.02, there is a tendency to destroy the electroconductive particles and to easily drop the metal thin layer. On the other hand, when the ratio is more than 0.95, a sufficient areal contact of conductor with electroconductive particles or contact of electroconductive particles each other cannot be obtained, which results in failing to obtain satisfactory connection reliability. Preferable range of the ratio of t/T is 0.10 to 0.90 by the same reasons as mentioned above.

As methods for obtaining the most suitable connecting state simply, there are a method of inserting spacers made of a rigid body having a desired thickness between the conductors at the time of connecting operation, a method of mixing spacer particles having a particle size smaller than that of the electroconductive particles but equal to the desired thickness between the conductors after connection, with the adhesive composition or adhesive film, etc. Since the electroconductive particles used in this invention can deform freely, the desired thickness can be obtained simply by applying the above-mentioned methods.

As the spacer particles, it is necessary to use those having higher rigidity than the electroconductive particles. That is, it is necessary that the spacer particles hardly show changes in the particle shape by the pressing or pressing with heating at the production of the connected conductor structure. On the other hand, the spacer particles may be either electroconductive or insulating, or a mixture of these spacer particles may also be used.

Figure 7:
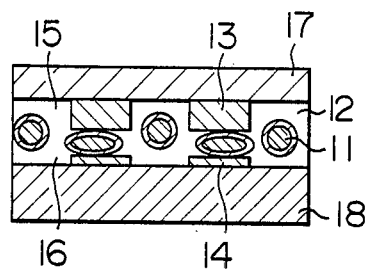
FIGS. 7 and 8 are schematic cross-sectional views of connected circuit structures of this invention.
Figure 8:
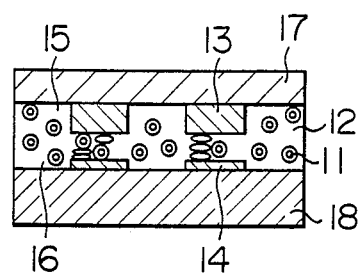

FIGS. 7 and 8 are schematic cross-sectional views of connected conductor structures of this invention. In FIGS. 7 and 8, the electroconductive particles 11 are dispersed in an insulating adhesive component 12 and are interposed between a conductor 13 formed on a substrate 17 and a conductor 14 formed on a substrate 18, and are so arranged as to form areal contact between electroconductive particles mutually or between electroconductive particles and conductor faces with suitable deformation in a pressed state along the conductor surfaces when subjected to pressing or pressing with heating at the time of conductor connection. On the other hand, between the non-conductor portions 15 and 16, since electroconductive particles are not pressed as those between the conductors, no deformation takes place. Therefore, insulating properties with respect to adjacent circuits can sufficiently be maintained in addition to the selection of the particle size and adding amounts of electroconductive particles.

As explained above, in the adhesive composition or film and the connected conductor structure of this invention, the metal coated on the polymeric core material forms an electroconductive path by contacting mutually with other electroconductive particles or with electroconductive conductors under pressure or pressure with heating at the time of connection.

At this time, since the polymeric core material can be softened or deformed at the time of connection operation under pressure or pressure with heating, it is possible to maintain the large contact area by properly deforming with pressing the conductor surfaces or electroconductive particles mutually, resulting in obtaining good electroconductivity and reliability. On the other hand, since particles in insulating conductor portions are not so pressed as those between the conductors, the insulating properties with regard to adjacent circuits can sufficiently be maintained, when the selection of the particle size and adding amount of electroconductive particles are also considered as well.

Further, since it is possible to set the softening deformation range of the polymeric core material in a desired range by proper selecting or combining thermal properties of polymeric core materials, it is possible to take the connection conditions in a very wide range. For example, when amorphous polymers showing no definite melting points or crosslinked polymers having a wide rubber-state region are used as the core material, it is possible to take the conductor connection conditions (temperature, pressure, time, etc.) very wide, since their softening flow regions (until glass state - rubber state - liquid state regions) are wide. As a result, reliability at the time of connection is remarkably improved and the connection workability is also bettered.

Figure 5:
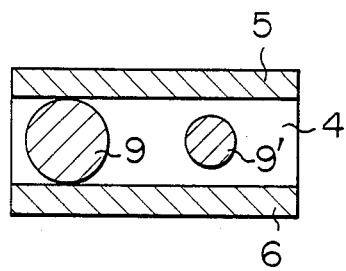
FIG. 5 is a schematic cross-sectional view of circuit connected portion using prior art electroconductive particles.

In addition, the degree of softening deformation of the polymeric core material can be set properly depending on their connecting conditions, so that it is possible to control the connecting state. For example, even if the particle size of electroconductive particles at the connecting portions is uneven, it is possible to press a larger electroconductive particle 8 to the size of a smaller electroconductive particle 8' or less as shown in FIG. 4 by controlling the connecting conditions so as to obtain good connection. Thus, the electroconductive particles can contribute to the electroconductivity effectively. In contrast, in the case of prior art metal particles as shown in FIG. 5, a larger electroconductive particle 9 functions as a spacer and a smaller electroconductive particle 9' does not contribute to the electroconductivity. Therefore, the number of electroconductive points are reduced to lower the connection reliability.

As to the electroconductive particles suitably pressed between the conductors, since the polymeric core material has a thermal expansion coefficient similar to that of the adhesive component, the adaptability to the temperature change after connection are high and long term connection reliability representative by thermal shock resistance is excellent.

Figure 6:
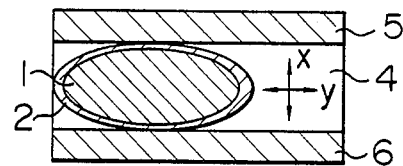
FIG. 6 is a schematic cross-sectional view of a conductor connected portion using electroconductive particles according to this invention.

This can be explained referring to FIG. 6. When the conductor connection portion according to this invention is subjected to a temperature change, stress is acted between the circuits 5 and 6 so as to separate each other by thermal expansion and shrinkage at the direction of y axis by the adhesive component 4 which has a relatively larger thermal expansion coefficient than the materials of the circuits 5 and 6. Since the thermal expansion coefficient of the polymeric core material 1 and that of the adhesive component 4 are very close, and the metal layer 2 is sufficiently thin, sufficient deformation at the thickness direction of the conductors 5 and 6 is possible and thus the electroconductive connection of the conductors can be maintained well. In this time, the adhesive component 4 is also to show thermal expansion and shrinkage at the direction of x axis. But since the modulus of elasticity of the adhesive component 4 is relatively sufficiently small compared with metallic conductors, the deformation is substantially inhibited. Further, since the modulus of elasticity is small, the thermal stress is easily relaxed.

On the other hand, in order to control the connecting state effectively, it is preferable to co-use spacer particles having higher rigidity than that of the electroconductive particles by adding the spacer particles to the connecting material. In such a case, since the electroconductive particles can be deformed optionally, it is possible to obtain a connected conductor structure having the desired thickness.

In the connected conductor structure according to this invention, since the electroconductive particles can be properly deformed when pressed along the conductor surfaces so as to maintain the contact area large, it is possible to effectively maintain the contact area of, for example, a transparent electroconductive film, which was impossible to be soldered according to a prior art technique. Further, it is not particularly necessary to conduct a surface treatment such as Au or Ni plating on the transparent electroconductive film. In addition, connected circuit structures can also be obtained as to other various conductor surfaces such as Sn, Cr, solder, etc.

Since the contact area with the conductors can be taken large and the thermal expansion coefficients of the polymeric core material and the adhesive component are very similar, broadening of the distance between the connected conductors can be solved without giving any influences by thermal expansion. Thus the contact state between the electroconductive particles and the conductors can be maintained well, and the resistance change against the temperature change at the connecting portion can be reduced to remarkably small.

This invention is illustrated by way of the following Examples, in which all parts and percents are by weight unless otherwise specified.

EXAMPLES 1 to 9 AND COMPARATIVE EXAMPLE 1

(1) Preparation of electroconductive particles

Electroconductive particles coated with Au and having different coating layer thickness as shown in Table 1 were prepared by using as a polymeric core material Finepearl (a trade name of polystyrene spherical particles, manufactured by Sumitomo Chemical Co., Ltd., specific gravity 1.05) having different average particle sizes and by an electroless plating method comprising the following steps (a) to (e).

(a) Pretreatment

A polymeric core material was stirred compulsorily in methanol and subjected to a pretreatment including both degreasing and roughening followed by separation of the methanol by filtration.

(b) Activation

Then, the polymeric core material was dispersed in 200 ml of Circuit Prep 3316 (a trade name for an activation treating solution comprising $PdCl+HCl+SnCl_2$, manufactured by Japan Electroplating Engineers Co., Ltd.) and stirred at 25° C. for 20 minutes for activation, followed by washing with water and filtration.

(c) Electroless plating

The polymeric core material subjected to the activation treatment was immersed in a solution of Blue Sumer (a trade name for an electroless Ni plating solution, manufactured by Japan Kanigen Co., Ltd., bath capacity 300 $\mu dm^2/l$) and stirred compulsorily at 90° C. for 30 minutes.

The plating solution amount was calculated from the surface areas of the particles.

On the surfaces of Ni coated polystyrene particles, the substitution plating of Au was carried out to give electroconductive particles having an Au coating (thickness 0.1 $\mu m$) over Ni surfaces. As the plating solution, Lectroles Prep (a trade name for an electroless gold plating solution, manufactured by Japan Electroplating Engineers Co., Ltd.) was used. The plating treatment was conducted at 90° C. for 10 minutes, followed by sufficient washing with water and drying at 80° C. for 2 hours.

(2) Preparation of Adhesive Composition

Adhesive compositions containing electroconductive particles were prepared by adding polystyrene spherical particles coated with Au plating with the particle size and the coating plating layer thickness as listed in Table 1 to an adhesive solution comprising 100 parts of styrene-butadiene block copolymer (MI 2.6 TAFUPLEN, a trade name, mfd. by Asahi Chemical Co., Ltd.), 40 parts of a terpene series tackifier (CLEARON P-125, a trade name, mfd. by Yushi Kogyo Co., Ltd.) and 200 parts of toluene in amounts as listed in Table 1, followed by ultrasonic dispersion.

(3) Preparation of Adhesive Film

Each adhesive composition obtained as mentioned above was coated on a separator (a polyester film treated with silicone) by using a bar coater and dried at 100° C. for 5 to 30 minutes depending on thickness to remove the solvent and to obtain an adhesive film.

(4) Evaluation

On a flexible plate circuit (FPC) of total circuit width of 100 mm having each circuit of line width of 0.1 mm, pitch 0.2 mm and thickness 35 $\mu m$, the above-mentioned adhesive film cut with adhesive width of 3 mm and length of 100 mm was placed and pressed with heating at 120° C. $-10$ kg/cm$^2$ for 5 seconds to give a preliminary bonded connection portion attached FPC.

After peeling off the separator, another FPC with the same pitch was placed on the separator-peeled-off-surface and adjusted so as to meet the FPC conductors under a microscope, followed by conductor connection under a pressure of 20 kg/cm$^2$ at 150° C. for 20 seconds.

The evaluation results are shown in Table 1. In each Example, since each adhesive sheet has transparency, the positioning of conductors was easy. Table 1 also shows properties of connected conductor structures. The connected structures obtained in individual Examples showed good electroconductive resistances and good insulating properties with respect to adjacent conductors. These properties were still good after reliability test.

In Comparative Example 1, the charge amount of the electroconductive particles was as large as 20% by volume. The positioning of the conductors was easy but there took place leak after the conductor connection.

EXAMPLES 10 to 13

The process of Examples 1 to 9 was repeated except for the kinds of electroconductive particles were changed. That is, in Examples 10 and 11, epoxy spherical particles (TORAYPEAL, a trade name, mfd. by Toray Industries, Inc.) were used as the polymeric core material and a Cu layer with 0.2 $\mu m$ thick was formed on the core particles and a Ni layer with 0.2 $\mu m$ thick was formed thereon to give a complex layer of metals. In Examples 12 and 13, an Au layer with 0.2 $\mu m$ thick was formed on an epoxy sperical particle. As the plating solutions, those of Ni and Au used in Examples 1 to 9 were used. As the Cu plating solution, there was used Circuit Prep (a trade name for an electroless copper plating solution, mfd. by Japan Electroplating Engineers Co., Ltd.). The electroless plating was carried out at 30° C. for 30 minutes. The adhesive component and the evaluation were the same as described in Examples 1 to 9. The evaluation results were shown in Table 1. In each Example, good properties were obtained at initial stage and after evaluation of reliability.

mfd. by Degussa Co., Ltd., in West Germany) at room temperature.

The results are shown in Table 1. The resistance at initial stage is good, but there takes place bad electroconductivity (open) in the reliability test.

Observation of the cross-section of conductor connection portions of Comparative Examples 2 to 4 by use of a scanning type electron microscope revealed that the electroconductive particles were not deformed but contacted in dot-like state with the conductors.

TABLE 1

| Example No. | Electroconductive particles | | | | | Adhexive composition or film | | Conductor connection properties | | | |
|---|---|---|---|---|---|---|---|---|---|---|---|
| | Thickness of coating layer ⓐ (μm) | Average particle size ⓑ (μm) | ⓐ/ⓑ | Particle Content (volume %) | | Thickness (μm) | Total light transmittance (%) | Conduction resistance (Ω) | | Insulating resistance (Ω) | |
| | | | | | | | | Initial stage | After reliability evaluation | Initial stage | After reliability evaluation |
| Example | | | | | | | | | | | |
| 1 | 1.0 | 50 | 0.02 | 0.90 | 1 | 100 | 41 | 0.85 | 1.20 | $10^9$ | $10^9$ |
| 2 | 1.0 | 50 | 0.02 | 0.90 | 1 | 50 | 65 | 0.48 | 0.75 | $10^{11}$ | $10^{11}$ |
| 3 | 0.1 | 5 | 0.02 | 0.70 | 0.1 | 20 | 85 | 0.80 | 1.10 | $10^{11}$ | $10^{11}$ |
| 4 | 0.1 | 5 | 0.02 | 0.70 | 0.5 | 15 | 82 | 0.48 | 0.52 | $10^{11}$ | $10^{11}$ |
| 5 | 0.1 | 5 | 0.02 | 0.70 | 5 | 10 | 70 | 0.30 | 0.48 | $10^{11}$ | $10^{11}$ |
| 6 | 0.1 | 5 | 0.02 | 0.70 | 10 | 7 | 57 | 0.21 | 0.30 | $10^{11}$ | $10^{11}$ |
| 7 | 0.1 | 5 | 0.02 | 0.70 | 15 | 5 | 52 | 0.08 | 0.08 | $10^9$ | $10^9$ |
| 8 | 0.1 | 0.5 | 0.20 | 0.50 | 2 | 3 | 86 | 0.06 | 0.08 | $10^{11}$ | $10^{11}$ |
| 9 | 0.1 | 0.5 | 0.20 | 0.50 | 2 | 1 | 88 | 0.02 | 0.03 | $10^{11}$ | $10^{11}$ |
| Comparative Example | | | | | | | | | | | |
| 1 | 0.1 | 0.5 | 0.20 | 0.50 | 20 | 0.7 | 75 | 0.02 | — | Leak | — |
| Example | | | | | | | | | | | |
| 10 | 0.4 | 3 | 0.13 | 0.60 | 2 | 15 | 76 | 0.32 | 0.50 | $10^{11}$ | $10^{11}$ |
| 11 | 0.4 | 3 | 0.13 | 0.60 | 2 | 30 | 62 | 0.44 | 0.62 | $10^{11}$ | $10^{11}$ |
| 12 | 0.2 | 25 | 0.007 | 0.64 | 4 | 25 | 45 | 0.50 | 0.74 | $10^{11}$ | $10^{11}$ |
| 13 | 0.2 | 25 | 0.007 | 0.64 | 4 | 25 | 41 | 0.72 | 0.80 | $10^{11}$ | $10^{11}$ |
| Comparative Example | | | | | | | | | | | |
| 2 | 0.2 | 25 | 0.007 | 0.60 | 4 | 25 | 48 | 1.20 | Open | $10^{11}$ | — |
| 3 | 0.2 | 25 | 0.007 | 0.95 | 4 | 25 | 45 | 1.42 | Open | $10^{11}$ | — |
| 4 | — | 25 | — | 0.52 | 4 | 25 | 40 | 0.85 | Open | $10^{10}$ | — |

Further, in Examples 10 and 11, it was admitted that the adhesive films had electroconductive particles agglomerated in a chain state at the thickness direction. Such a phenomenon seems to be caused by preferential shrinkage of the adhesive component at the film thickness direction during the solvent drying step at the time of film production. This is a preferable form as an anisotropic-electroconductive material. Such a phenomenon easily takes place when the particle size of electroconductive particles is relatively small compared with the film thickness.

COMPARATIVE EXAMPLES 2 to 4

Films were prepared and evaluated in the same manner as described in Examples 1 to 13 except for changing the kinds of electroconductive particles. That is, as the electroconductive particles, there were used atomized Ni spheres coated with Au (Comparative Example 2), glass spheres coated with Ag (Comparative Example 3), and solder particles having a melting point of 150° C. (Comparative Example 4).

The atomized Ni spheres was available from Takeuchi Metal Foil & Powder Engineering Co., Ltd., the glass spheres were available from Toshiba Ballotini Co., Ltd. and the solder particles were available from Nippon Genma Co., Ltd. The Au coating was conducted by using the same electroless Au plating solution as used in Examples 1 to 9. Further, the electroless Ag plating was conducted by using ALGNA-ET (a trade name,

EXAMPLES 14 TO 16

Electroconductive particles were obtained by coating (sputtering as described in Japanese patent Unexamined publication No. 56-130469) spherical particles of acrylonitrile-butadiene rubber (NBR) (Nipol DN-214, a trade name, mfd. by Japanese GEON Co., Ltd., acrylonitrile content 33%, Mooney viscosity 78) with Al by vapor deposition.

These electroconductive particles were mixed and dispersed in an acrylic adhesive (TEISAN EXP-24, a trade name, mfd. by TEIKOKO CHEMICAL INDUSTRY, Co., Ltd., containing 5% of acrylic acid as functional groups, Tg=−40° C., viscosity 1000 cps/25% toluene solution at 25° C.) having a curing agent as shown in Table 2. After preliminary adhering the resulting adhesive composition to an FPC at room temperature, transparent electroconductive glass having a conductor with the same pitches as the FPC and 0.5 mm thick was press bonded thereto between a pair of rolls under conditions of 25° C. - 5 kg/cm² - 2 seconds. Then, the resulting product was subjected to post cure as shown in Table 2. These products were evaluated in the same manner as described in Examples 1 to 9 and the results were listed in Table 3.

TABLE 2

| Example No. | Curing agent (Curing accelerator) | Post cure |
|---|---|---|
| 14 | Polyfunctional aromatic | None |

TABLE 2-continued

| Example No. | Curing agent (Curing accelerator) | Post cure |
|---|---|---|
| 15 | polyisocyanate (3 PHR) ibid (3 PHR) | heat cure 120° C. - 1 hr |
| 16 | Benzophenone (3 PHR) | Ultraviolet cure 100 mW/cm², 20 sec |

In Examples 14 to 16, since a pressure-sensitive adhesive was used as a major component of the adhesive, it was possible to carry out conductor connection at room temperature. Further, since it was possible to connect by press bonding between rolls, it was possible to conduct the conductor connection in a short time.

In Example 14, a rise in resistance value in the reliability test was relatively large, but within the range causing no problem in practical use.

In Examples 15 and 16, since the connected portions were provided with heat resistance by cross-linking cure using heat or ultraviolet light, the rise in resistance values after the reliability test was small.

Higher level of the resistance values in Examples 14 to 16 than Examples 1 to 13 seems to be drived from containing conductor resistance of transparent electroconductive glass. In Example 16, the ultraviolet light was irradiated from the glass conductor side.

EXAMPLES 17 TO 19 AND COMPARATIVE EXAMPLE 5

In order to change properties of the polymeric core materials and adhesive components, the combination of individual materials was changed. Combination of individual materials and test results were shown in Table 3.

The coating of a polymeric core material was carried out by using the same Ag plating solution as used in Comparative Example 3 and plating of Ag in 0.2 μm thick. As the polymeric core material, a powdery polyimide (mfd. by Rhone-Poulenc S.A.) was used. As the polyester, a thermoplastic polyester (BYRON 300, a trade name, mfd. by TOYOBO Co., Ltd., molecular weight (M̄n) about 20,000, Tg 7° C.) was used. The same NBR as used in Examples 14 to 16 was used. The same acrylic rubber as used in Examples 14 to 16 was used as the adhesive component. As the polyester, the same thermoplastic polyester as used for the polymeric core material was used. As the polymeric core materials, there were used those of 270 mesh pass and 325 mesh on in Examples 17 and 18, and those of 150 mesh pass and 170 mesh on in Example 19.

In Example 19, FPC (Cu thickness, 35 μm) having conductors of a pitch of 0.4 mm (circuit width 0.2 mm) and transparent electroconductive glass was used.

The evaluation was conducted in the same manner as described in Examples 14 to 16. In Examples 18 and 19 and Comparative Example 5, the connection conditions were changed to 70° C. - 20 kg/cm² - 20 seconds in order to increase the adhesiveness of the adhesive components.

The results were shown in Table 3. As is clear from Table 3, good properties were obtained in all the Examples. Particularly in Example 19, since the same material was used for the polymeric core material and the adhesive component, particularly excellent properties were shown in the adaptability at the time of thermal expansion and shrinkage and in the reliability test.

In Comparative Example 5, there was taken a combination of the polymeric core material having a larger thermal expansion coefficient and a smaller modulus of elasticity than the adhesive component. But when heated so as to flow the adhesive component, leak was generated due to greater flowability of the polymeric core material.

EXAMPLES 20 TO 21

Using particles having an average particle size of 300 μm (maximum particle size 350 μm) as the electroconductive particles, production of adhesive compositions and films was changed. That is, as the polymeric core material, epoxy particles (TORAY PEAL, TORAY INDUSTRIES, Inc.) were used, and Ni layer was formed thereon by electroless plating in the same manner as described in Examples 1 to 9. As the adhesive component, the polyester used in Example 18 was used.

In Example 20, the adhesive composition was heated at 190° C. and film casted between heated rolls to produce a film by hot melt coating, followed by preliminary adhesion to an FPC.

In Example 21, an adhesive composition dissolved in a solvent (30% solution of methyl ethyl ketone, in this case) as in Examples 1 to 9 was directly coated on an FPC by silk screen printing, followed by removal of the solvent by drying to give the FPC having thereon the adhesive composition.

In Examples 20 and 21, the FPC having pitches of 1.27 mm (Cu foil conductors with width 0.635 mm, and circuit thickness 35 μm) was used.

Properties obtained when transparent electroconductive glass having the same pitches as the FPC was connected were shown in Table 3.

As is clear from Table 3, good properties are obtained in Examples 20 and 21. In Example 20, since no solvent was used, the working circumstances were good. In Example 21, since the adhesive composition was directly coated on the conductor, it was not necessary to conduct a preliminary adhesion operation at the time of circuit connection. Further, it was impossible to measure a total light transmittance of only the adhesive composition layer, but since the adhesive composition layer had the same transparency as in Example 21 after preliminary adhesion to the FPC, the registering of conductors was easy.

Table 4 shows combinations of the polymeric core materials and adhesive components used in the above-mentioned Examples and Comparative Examples and properties of these materials (thermal expansion coefficients and modulus of elasticity). As shown in Table 4, better results were obtained when the ratio of thermal expansion coefficients (adhesive component/electroconductive particles) is 0.66 to 8.93 and the ratio of modulus of elasticity (adhesive component/electroconductive particles) is 0.02 to 1.2.

TABLE 3

| | Electroconductive Particles | | | | | Adhesive composition or film | | |
|---|---|---|---|---|---|---|---|---|
| Example No. | Material | Coating layer thickness ⓐ (μm) | Average particle size ⓑ (μm) | ⓐ/ⓑ | Particle size ratio | Content (volume %) | Adhesive component | Thickness (μm) | Total light transmittance (%) |

TABLE 3-continued

| Example | | | | | | | | | | |
|---|---|---|---|---|---|---|---|---|---|---|
| 14 | rubber AN—Bt rubber | 0.2 | 20 | 0.01 | 0.3 | 2 | rubber Acrylic rubber | 30 | 60 | |
| 15 | AN—Bt rubber | 0.2 | 20 | 0.01 | 0.3 | 2 | Acrylic rubber | 30 | 60 | |
| 16 | AN—Bt rubber | 0.2 | 20 | 0.01 | 0.3 | 2 | Acrylic | 30 | 60 | |
| Example | | | | | | | | | | |
| 17 | Polyimide | 0.2 | 50 | 0.004 | 0.06 | 1 | Acrylic rubber | 50 | 63 | |
| 18 | Polyimide | 0.2 | 50 | 0.004 | 0.06 | 1 | Polyester | 50 | 65 | |
| 19 | Polyester | 0.2 | 100 | 0.002 | 0.25 | 1 | Polyester | 100 | 42 | |
| Comparative Example | | | | | | | | | | |
| 5 | AN—Bt rubber | 0.2 | 20 | 0.01 | 0.3 | 1 | Polyester | 50 | 62 | |
| Example | | | | | | | | | | |
| 20 | Epoxy | 0.3 | 300 | 0.001 | 0.52 | 0.3 | Polyester | 300 | 41 | |
| 21 | Epoxy | 0.3 | 300 | 0.001 | 0.52 | 0.3 | Polyester | 300 | — | |

| | Conductor connection properties | | | |
|---|---|---|---|---|
| | Conduction resistance ($\Omega$) | | Insulating resistance ($\Omega$) | |
| Example No. | Initial stage | After reliability evaluation | Initial stage | After reliability evaluation |
| Example | | | | |
| 14 | 5.2 | 40 | $10^{11}$ | $10^{11}$ |
| 15 | 6.0 | 12 | $10^{11}$ | $10^{11}$ |
| 16 | 5.4 | 8 | $10^{11}$ | $10^{11}$ |
| Example | | | | |
| 17 | 5.0 | 10.0 | $10^{11}$ | $10^{11}$ |
| 18 | 4.5 | 7.2 | $10^{11}$ | $10^{11}$ |
| 19 | 4.2 | 4.5 | $10^{11}$ | $10^{11}$ |
| Comparative Example | | | | |
| 5 | 4.6 | — | Leak | — |
| Example | | | | |
| 20 | 1.8 | 2.0 | $10^{11}$ | $10^{11}$ |
| 21 | 1.8 | 2.1 | $10^{11}$ | $10^{11}$ |

(Note)
AN = acrylonitrile
Bt = butadiene

TABLE 4

| | Polymeric core material | | | Adhesive component | | | Ratio | |
|---|---|---|---|---|---|---|---|---|
| Example No. | Material | Thermal expansion coefficient $\alpha_1(\times 10^{-5}/°C.)$ | Modulus of elasticity $E_1(kg/cm^2)$ | Material | Thermal expansion coefficient $\alpha_2(\times 10^{-5}/°C.)$ | Modulus of elasticity $E_2(kg/cm^2)$ | Ratio of $\alpha_2/\alpha_1$ | Ratio of $E_2/E_1$ |
| Examples 1–9 | Polystyrene | 8.5 | 320 | St—Bt block copolymer | 12.2 | 140 | 1.44 | 0.44 |
| Examples 10–13 | Epoxy | 6.0 | 250 | St—Bt block copolymer | 12.2 | 140 | 2.03 | 0.56 |
| Comparative Examples | | | | | | | | |
| 2 | (Ni) | 1.5 | $21 \times 10^3$ | St—Bt block copolymer | 12.2 | 140 | 8.13 | $6.7 \times 10^{-3}$ |
| 3 | (Glass) | 0.35 | $7 \times 10^3$ | St—Bt block copolymer | 12.2 | 140 | 34.9 | 0.02 |
| Examples | | | | | | | | |
| 14 | AN—Bt rubber | 18.2 | 10 | Acrylic rubber | 25 | 8 | 1.37 | 0.80 |
| 15 | AN—Bt rubber | 18.2 | 10 | Acrylic rubber | 15 | 9 | 0.82 | 0.90 |
| 16 | AN—Bt rubber | 18.2 | 10 | Acrylic rubber | 12 | 12 | 0.66 | 1.20 |
| Examples | | | | | | | | |
| 17 | Polyimide | 2.8 | 400 | Acrylic rubber | 25 | 8 | 8.93 | 0.02 |
| 18 | Polyimide | 2.8 | 400 | Polyester | 8.6 | 220 | 3.07 | 0.55 |
| 19 | Polyester | 8.6 | 220 | Polyester | 8.6 | 220 | 1.0 | 1.00 |
| Examples 20, 21 | Epoxy | 6.0 | 250 | Polyester | 8.6 | 220 | 1.43 | 0.88 |

TABLE 4-continued

| Example No. | Polymeric core material | | | Adhesive component | | | Ratio | |
|---|---|---|---|---|---|---|---|---|
| | Material | Thermal expansion coefficient $\alpha_1(\times 10^{-5}/°C.)$ | Modulus of elasticity $E_1(kg/cm^2)$ | Material | Thermal expansion coefficient $\alpha_2(\times 10^{-5}/°C.)$ | Modulus of elasticity $E_2(kg/cm^2)$ | Ratio of $\alpha_2/\alpha_1$ | Ratio of $E_2/E_1$ |
| Comparative Example 5 | AN—Bt rubber | 18.2 | 10 | Polyester | 8.6 | 220 | 0.47 | 22.0 |

Note)
St = styrene

EXAMPLES 22 TO 25

Using the adhesive film obtained in Example 11 and the same combination of conductors as in Example 14 (FPC/transparent electroconductive glass, pitch 0.2 mm), influences by connection conditions were examined.

The results are shown in Table 5. As is clear from Table 5, better results are obtained in wide connection conditions of temperatures of 130° to 180° C., pressures of 5 kg/cm² to 50 kg/cm², and periods of 5 to 50 seconds. The ratio of the adhesive film thickness before to after the connection was 0.02 to 0.50.

In Examples 22 and 23, several electroconductive particles were aligned at the film thickness direction with compressed deformation and contacted with the conductors.

In Example 24, since the distance between the circuits was reduced to 3 μm which value was the same as the average particle size of the electroconductive particles, the contact points and contact areas with the conductors were remarkably increased. In Example 25, since individual electroconductive particles were sufficiently pressed and deformed in a single particle layer, the contact areas with the conductors were further increased.

In individual Examples, it was possible to obtain conductor connections with good initial properties in both the conduction resistance and insulating resistance, and with little increase in the resistances after the reliability test.

EXAMPLES 26 TO 32

Using the adhesive film obtained in Example 12 and the same combination of circuits as in Examples 22 to 25 (FPC/transparent electroconductive glass), influences by connection conditions were examined.

The results are shown in Table 5. As is clear from Table 5, it was possible to obtain connections with high reliability in the same wide connection conditions as in Examples 22 to 25.

In Examples 26 to 32, since the adhesive film thickness was the same as the particle size of electroconductive particles, the electroconductive particles were deformed in a single particle layer between the conductors. The ratio of the thickness change was 0.30 to 0.90.

COMPARATIVE EXAMPLES 6 TO 12

Using the adhesive film obtained in Comparative Example 4, the evaluation was carried out in the same manner as described in Examples 26 to 32. The results are shown in Table 5.

When the temperature at the time of connection was lower than the melting point (150° C.) of solder particles, the reliability at the thermal shock test was low, while when the connection temperature was 180° C. which is higher than the melting point of solder particles, the solder particles melted and spreaded to adjacent conductors to generate leak. When the connection temperature was 150° C. which temperature is the same as the melting point of solder particles, the reliability was low in the case of using a short time or low pressure, while the time or pressure was in excess, leak was generated. Most suitable connection conditions were in a very narrow range.

TABLE 5

| Example No. | Connection conditions | | | Change in thickness | | | Conduction resistance (Ω) | | Insulating resistance (Ω) | |
|---|---|---|---|---|---|---|---|---|---|---|
| | Temperature (°C.) | Pressure (kg/cm²) | Time (sec) | Before connection (μm) | After connection (μm) | Ratio before to after connection | Initial stage | After reliability evaluation | Initial stage | After reliability evaluation |
| Example 22 | 130 | 20 | 5 | 30 | 15 | 0.50 | 5.0 | 7.0 | $10^{11}$ | $10^{11}$ |
| Example 23 | 150 | 5 | 20 | 30 | 6 | 0.20 | 3.5 | 4.0 | $10^{11}$ | $10^{11}$ |
| Example 24 | 150 | 50 | 20 | 30 | 3 | 0.10 | 2.5 | 3.5 | $10^{10}$ | $10^{10}$ |
| Example 25 | 180 | 50 | 50 | 30 | 0.6 | 0.02 | 2.0 | 3.0 | $10^{9}$ | $10^{9}$ |
| Example 26 | 130 | 20 | 20 | 30 | 27 | 0.90 | 7.2 | 20 | $10^{11}$ | $10^{11}$ |
| Example 27 | 150 | 5 | 20 | 30 | 25 | 0.83 | 6.0 | 15 | $10^{11}$ | $10^{11}$ |
| Example 28 | 150 | 20 | 5 | 30 | 24 | 0.80 | 6.0 | 17 | $10^{11}$ | $10^{11}$ |
| Example 29 | 150 | 20 | 20 | 30 | 18 | 0.60 | 5.0 | 16 | $10^{11}$ | $10^{11}$ |
| Example 30 | 150 | 20 | 50 | 30 | 12 | 0.40 | 4.5 | 12 | $10^{11}$ | $10^{11}$ |
| Example 31 | 150 | 50 | 20 | 30 | 15 | 0.50 | 3.5 | 10 | $10^{11}$ | $10^{11}$ |
| Example 32 | 180 | 20 | 20 | 30 | 9 | 0.30 | 3.5 | 10 | $10^{11}$ | $10^{11}$ |
| Comparative 6 Example | 130 | 20 | 20 | 30 | 30 | 1.00 | 10 | Open | $10^{10}$ | — |
| Comparative 7 Example | 150 | 5 | 20 | 30 | 30 | 1.00 | 8.0 | Open | $10^{10}$ | — |
| Comparative 8 Example | 150 | 20 | 5 | 30 | 30 | 1.00 | 7.5 | Open | $10^{10}$ | — |

TABLE 5-continued

| Example No. | Connection conditions | | | Change in thickness | | | Conduction resistance (Ω) | | Insulating resistance (Ω) | |
| --- | --- | --- | --- | --- | --- | --- | --- | --- | --- | --- |
| | Temperature (°C.) | Pressure (kg/cm²) | Time (sec) | Before connection (μm) | After connection (μm) | Ratio before to after connection | Initial stage | After reliability evaluation | Initial stage | After reliability evaluation |
| Comparative 9 Example | 150 | 20 | 20 | 30 | 29 | 0.97 | 6.2 | Open | 10¹⁰ | — |
| Comparative 10 Example | 150 | 20 | 50 | 30 | 3 | 0.10 | 6.0 | — | Leak | — |
| Comparative 11 Example | 150 | 50 | 20 | 30 | 6 | 0.20 | 5.2 | — | Leak | — |
| Comparative 12 Example | 180 | 20 | 20 | 30 | 6 | 0.20 | 5.0 | — | Leak | — |

In Tables 1, 3 and 5, the evaluations were conducted under the following conditions.

(1) Conduction resistance:

Resistance between electrodes oppositely faced each other of two connected conductors was measured by using a Multimeter (manufactured by TAKEDA RIKEN Co., Ltd., connection area 0.1 mm×3 mm). The value larger than $10^3$ Ω was evaluated as "open".

(2) Insulating resistance:

Resistance between adjacent conductors of two connected conductors was measured by using a high megohm meter (manufactured by TAKEDA RIKEN Co., Ltd.).

The value lower than $10^6$ Ω was evaluated as "leak".

(3) Reliability:

Reliability was evaluated by subjecting a pair of conductors connected by using an adhesive film or the like to 10 cycles of a thermal shock test, one cycle comprising −40° C. for 30 minutes/+100° C. for 30 minutes, measuring resistance and compared with an initial resistance value. The thermal shock test is the most important and reliable test method as a practical test, since it can estimate the length of life by the evaluation in a short time with the most severe conditions.

(4) Total light transmittance:

Total light transmittance was measured according to JIS K-6714 using a digital turbidimeter NDH-20D manufactured by NIPPON DENSHOKU Co., Ltd.

(5) Thermal expansion coefficient:

Modulus of elasticity:

A specimen was prepared by pressing with heating or a solvent removal method in the case of a thermal reactive system to give a sheet of about 500 μm thick. Using this specimen, the thermal expansion coefficient was measured by using a thermal mechanical analyser (TMA-1500 manufactured by SHINKU RIKOU Co., Ltd.). The modulus of elasticity was measured by using this specimen with a Tensilon UTM-1 manufactured by TOYO BALDWIN Co., Ltd. according to ASTM D882-64T.

EXAMPLES 33 TO 35

(1) Preparation of connecting material

Electroconductive particles having an average particle size of 20 μm were prepared by coating Au, Ag or Ni layers by an electroless plating method on the surfaces of the same epoxy resin particles as used in Examples 10 to 13 used as the polymeric core material. The thickness of each metal layer was 0.2 μm.

On the other hand, 100 parts of thermoplastic polyester (BYRON 300, a trade name, mfd. by TOYOBO Co., Ltd., molecular weight ($\overline{M}_n$) 20,000, Tg 7° C.) and 20 parts of alkylphenol resin (HITANOL 2400, a trade name, mfd. by HITACHI Chemical Co., Ltd., softening point 100° C.) were dissolved in 280 parts of methyl ethyl ketone to give an adhesive solution having a solid content of 30%.

The adhesive solution was mixed with the electroconductive particles mentioned above, coated on a separator (silicone treated polyester film) with a bar coater, and dried at 110° C. for 5 minutes to give a film-like connecting material having 5% by volume of the electroconductive particles and a thickness of 25 μm.

(2) Connection of conductors

On a 100 mm width of a connector of flexible printed circuit (FPC) having copper conductors (each conductor has 0.1 mm width, a pitch of 0.2 mm and 35 μm thickness) a connecting material of connecting width of 3 mm and length of 100 mm was placed and pressed with heating at 150° C. and a pressure of 10 kg/cm² for 5 seconds for preliminary bonding to give a connecting material attached FPC. Then, the separator was peeled off, and transparent electroconductive glass (indium oxide circuit, glass thickness 1 mm) having the same pitch as the FPC was placed thereon so as to register the conductors under a microscope and pressed with heating at 170° C. under a pressure of 20 kg/cm² for 10 seconds for conductor connection.

(3) Evaluation

Conductor connected portions were held in a constant temperature bath, and connection resistance of the conductors at −20° C. and +80° C. was measured by using a Multimeter and insulating properties between adjacent conductors were also checked. Insulating properties were evaluated as good when the value was $10^7$ Ω or more. Measured results of the resistance were expressed by a changing rate of resistance at 80° C. taking the value at −20° C. as 1.0.

Figure 10:
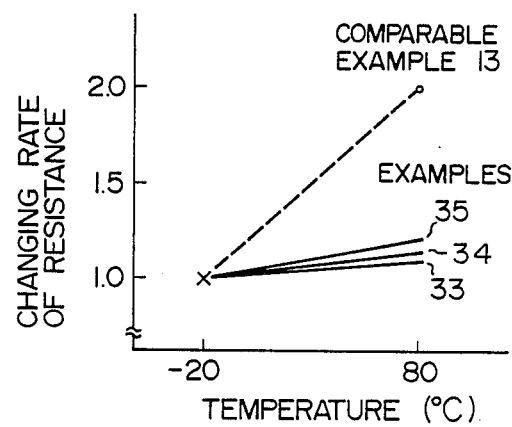
FIG. 10 is a graph showing a relationship between the changing rate of resistance and the temperature.

The results are shown in Table 6 and FIG. 10. As is clear from these results, there is obtained a positive changing rate wherein higher resistance was obtained at higher temperature side. In Examples 33 to 35, the changing rate of resistance was as stable as 1.1 to 1.2 times. When the conductor connection portions were observed by using a microscope from the transparent electroconductive film side, it was admitted that electroconductive particles were pressed flat at conductor surface to increase contact areas. In Table 6, the change in thickness means the ratio of the conductor distance after connection (t) to the thickness of the connecting material before connection (T), i.e. t/T.

COMPARATIVE EXAMPLE 13

The process of Examples 33 to 35 were repeated except for using solder particles having a particle size of 20 μm and a melting point of 170° C. without polymeric core material as the electroconductive particles.

The results are shown in Table 6 and FIG. 10. The change rate was about 2 times as large as those of Examples 33 to 35.

When the connecting portions were observed, the Cu conductor surface of the FPC side was wetted with solder and connected well, but the transparent electroconductive film side was not wetted with solder and only contacted with in a point-state. Therefore, since the deformation of solder particles is slight due to metal compared with the large change in thermal expansion and shrinkage of the adhesive layer, the solder particles form unstable contact with the conductor surface of transparent electroconductive glass, which seems resulting in large changing rate of resistance.

EXAMPLE 36

In an adhesive solution comprising 100 parts of styrene-butadiene block copolymer (TAFUPLEN, a trade name, mfd. by Asahi Chemical Co., Ltd., MI 2.6), 40 parts of rosin modified phenol resin (Tamanol, a trade name, mfd. by Arakawa Chemical Co., Ltd.) and 200 parts of toluene, polystyrene particles coated with Ni layer were dispersed. A connecting material containing 2% by volume of electroconductive particles and having a thickness of 35 μm was obtained in the same manner as described in Examples 33 to 35. The average particle size of electroconductive particles was 30 μm and the thickness of Ni coating layer was about 0.5 μm.

Conductor connection was carried out and evaluated in the same manner as described in Examples 33 to 35. The results obtained by changing the connecting conditions are shown in Table 6, wherein the changing rates of resistance at individual connecting conditions are small and good.

EXAMPLE 37

The adhesive film preparation and evaluation thereof were carried out in the same manner as described in Example 36 except that at the preparation of the connecting material atomized Ni (mfd. by Fukuda Metal & Powder Co., Ltd., average particle size 10 μm, almost spherical) was added in addition to the Ni coated polystyrene particles.

The results are shown in Table 6. The changing rate of resistance was good. Further, in Examples 37-2 and 37-4, the thickness after conductor connection was controlled by the particle size (10 μm) of the electroconductive Ni particles which were used as the spacer particles. By the use of electroconductive spacer having the smaller particle size than that of electroconductive particles made from polymeric core material, the electroconductive particles made from polymeric core material were present between the conductors in a slightly pressed state together with Ni particles to obtain a preferable connection state. In Example 37-1 wherein connection was carried out at 130° C., the thickness between the conductors was 18 μm which was larger than the spacer particle size of 10 μm, since flowability of both the polymeric core material and the adhesive component was insufficient. When the temperature is to be raised higher or other means, it is possible to control the thickness to the spacer particle size.

EXAMPLE 38

The process of Example 37 was repeated except for using an insulating silica powder (ELSIL, a trade name, mfd. by Japan Aerosil Co., Ltd., particle size 10μ, sperical) in place of atomized Ni as the spacer particles.

The results are shown in Table 6. As is clear from Table 6, it was possible to obtain good resistance changing rate and good control of thickness of connected circuits.

The addition of insulating spacer particles seems to be effective for preventing the leak between conductors. Further, the addition of a so-called low thermal expansion material such as silica, or the like is effective for lowering the thermal expansion coefficient of the whole matrix (the adhesive in this Example). These effects in combination were also obtained in this Example.

EXAMPLE 39

The process of Example 38 was repeated except for using particles having an average particle size of 3 μm (the Ni coating layer having a thickness of 0.1 μm) as the electroconductive particles so as to give a film-like connecting material of 15 μm thick and containing 2% by volume of the electroconductive particles. This Example corresponds to the use of spacer particles having a larger particle size than the electroconductive particles.

The results are shown in Table 6. As is clear from Table 6, good resistance changing rate was obtained and the thickness between conductors after connection could be reduced to the same size as the particle size of spacer particles. Observation of cross section of connected portion by an electron microscope revealed that several electroconductive particles were aligned in agglomerated state between the conductors.

TABLE 6

| | Connecting material | | | | | Connecting conditions | | | Change in thickness | | | Changing | |
|---|---|---|---|---|---|---|---|---|---|---|---|---|---|
| | | Electroconductive particles | | | | | | | | | | | |
| Example No. | Adhesive component material | Particle size (μm) | Metal layer (μm) | Content (vol. %) | Spacer particles | Temp. (°C.) | Pressure (kg/cm²) | Time (sec) | Before connection T (μm) | After connection t (μm) | Ratio of t/T | rate of resistance (80° C./ −20° C.) | Insulating properties |
| Example | | | | | | | | | | | | | |
| 33 | Polyester | 20 | Au - 0.2 | 5 | — | 170 | 20 | 10 | 25 | 10 | 0.40 | 1.10 | |
| 34 | Polyester | 20 | Ag - 0.2 | 5 | — | 170 | 20 | 10 | 25 | 10 | 0.40 | 1.12 | |
| 35 | Polyester | 20 | Ni - 0.2 | 5 | — | 170 | 20 | 10 | 25 | 12 | 0.48 | 1.16 | |
| Comparative Example | | | | | | | | | | | | | |
| 13 | Polyester | 20 | (Solder particles) | 5 | — | 170 | 20 | 10 | 25 | 15 | 0.60 | 2.02 | |
| Example | | | | | | | | | | | | | |

TABLE 6-continued

| | Connecting material | | | | | | | | | | | |
|---|---|---|---|---|---|---|---|---|---|---|---|---|
| | | Electroconductive particles | | | | Connecting conditions | | | Change in thickness | | | Changing |
| Example No. | Adhesive component material | Particle size (μm) | Metal layer (μm) | Content (vol. %) | Spacer particles | Temp. (°C.) | Pressure (kg/cm²) | Time (sec) | Before connection T (μm) | After connection t (μm) | Ratio of t/T | rate of resistance (80° C./ −20° C.) | Insulating properties |
| 36-1 | Styrene- | 30 | Ni - 0.5 | 2 | — | 130 | 5 | 20 | 35 | 25 | 0.71 | 1.25 | |
| 2 | butadiene | | | | — | 160 | 30 | 20 | 35 | 10 | 0.29 | 1.20 | |
| 3 | copolymer | | | | — | 200 | 50 | 20 | 35 | 4 | 0.11 | 1.17 | |
| Example 37-1 | Styrene- | 30 | Ni - 0.5 | 2 | Ni - 10 μm | 130 | 5 | 20 | 35 | 18 | 0.51 | 1.20 | |
| 2 | butadiene | | | | 2 vol. % | 160 | 30 | 20 | 35 | 10 | 0.29 | 1.17 | |
| 3 | copolymer | | | | | 200 | 50 | 20 | 35 | 10 | 0.29 | 1.13 | |
| Example 38-1 | Styrene- | 30 | Ni - 0.5 | 2 | Silica - 10 μm | 130 | 5 | 20 | 35 | 16 | 0.46 | 1.23 | |
| 2 | butadiene | | | | 2 vol. % | 160 | 30 | 20 | 35 | 10 | 0.29 | 1.17 | |
| 3 | copolymer | | | | | 200 | 50 | 20 | 35 | 10 | 0.29 | 1.15 | |
| Example 39-1 | Styrene- | 3 | Ni - 0.1 | 2 | Silica - 10 μm | 130 | 5 | 20 | 15 | 10 | 0.53 | 1.20 | |
| 2 | butadiene | | | | 2 vol. % | 160 | 30 | 20 | 15 | 10 | 0.53 | 1.16 | |
| 3 | copolymer | | | | | 200 | 50 | 20 | 15 | 10 | 0.53 | 1.10 | |

As explained above, in the adhesive composition and adhesive film for conductor connection and a process for connecting conductors by using such an adhesive composition or film, since electroconductive particles which comprise polymeric core materials and coated thereon metal thin layers having electroconductivity are used, they can properly be deformed by pressing at the time of conductor connection so as to maintain the contact area large, which results in obtaining excellent electroconductivity and good reliability. On the other hand, in insulating circuit portions, since the pressure is not so applied as to the electroconductive particles between the conductors, the insulating properties between adjacent conductors can be maintained sufficiently. Therefore, the present invention can be applied to connection of fine conductors.

Further, since the softened deformation region of the polymeric core material is sufficiently large compared with a metal having a constant melting point, it becomes possible to employ wider conditions for conductor connection operation, resulting in improving the reliability at the time of connection.

Further, the thermal expansion coefficient of the polymeric core material is close to that of the adhesive component, even if the distance between the connecting conductors becomes large due to the thermal expansion of the adhesive component, good contact state between the particles and the conductors can be maintained by the thermal expansion of the electroconductive particles.

In addition, the control of connecting state can be carried out by a relatively easy method such as a thickness measurement. Moreover, since the adhesive film has transparency, registration of fine conductors can easily be carried out by an aid of transmitting light. Further, since the electroconductive particles use metals effectively, this invention is very significant from the viewpoint of saving resourses.

As to the connected conductor structure according to this invention, since electroconductive particles which comprise polymeric core materials and coated thereon metal thin layers having electroconductivity are used, they can properly be softened or deformed between conductor surfaces or by electroconductive particles mutually by pressing or pressing with heating at the time of conductor connection, so as to maintain the contact area large. Further, since the polymeric core material has rigidity and thermal expansion and shrinkage properties very close to those of the adhesive component compared with prior art metal particles and can follow the deformation of the adhesive component due to thermal expansion and shrinkage depending on temperature changes, it is possible to make the connected conductor structure small in resistance change. Moreover, since the polymeric core materials can take a structure wherein the electroconductive metal thin layers are present in compressed form in contact with conductor surfaces due to the elasticity of the polymeric core materials, they have no selectivity for conductor materials such as transparent electroconductive films. Thus it becomes possible to obtain effective connected conductor structures excellent in reliability using a non-treated transparent electroconductive film which required a special surface treatment according to a prior art technique.

Further, in the connected conductor structure of this invention, since the core material of electroconductive particles is a polymer, a wide range of connecting conditions can be employed due to wide range of softening and deformation of the polymer, which results in providing stable connected conductor structures with little deviation.

In addition, when spacer particles are co-used in the connecting material, it becomes possible to control the conductor distance in the connected conductor structure.

Further, the connected conductor structure of this invention uses metals effectively in its electroconductive particles, this invention is also significant from the viewpoint of saving resources.

What is claimed is:

1. An adhesive composition for connecting conductors and capable of exhibiting anisotropic-electroconductivity by applying pressure or pressure with heating comprising 0.1 to 15% by volume of electroconductive particles and 99.9 to 85% by volume of an electrically insulating adhesive component, each electroconductive particle comprising a polymeric material as a core, material and an electrically conductive thin metallic layer coated on almost the whole surface of said core material.

2. An adhesive composition according to claim 1, wherein the electroconductive particles have an aspect ratio of 0.05 to 1.0 and an average particle size (diameter) of 0.5 to 300 μm, and the ratio of the thermal expansion coefficient of the adhesive component to that of the core material being 0.1/1 to 10/1 and the ratio of the modulus of elasticity in tension of the adhesive component to that of the core material being 1.2/1 to 0.01/1.

3. An adhesive composition according to claim 1, wherein the core material has plastic deformation properties under a pressure or a pressure with heating.

4. An adhesive composition according to claim 2, wherein the core material has a thermal expansion coefficient of $20 \times 10^{-5}$ (1/° C.) to $2 \times 10^{-5}$ (1/° C.).

5. An adhesive composition according to claim 2, wherein the thickness of the metal thin layer is 0.01 to 5 μm and 1/5 to 1/1000 of the average particle size diameter of the electroconductive particles.

6. An adhesive composition according to claim 2, wherein the adhesive component has heat-sensitive adhesiveness.

7. An adhesive composition according to claim 2, wherein the adhesive component has pressure-sensitive adhesiveness.

8. An adhesive composition according to claim 2, wherein the adhesive component is at least one material selected from the group consisting of a heat curing type and a photocuring type.

9. An adhesive film for connecting conductors and capable of exhibiting anisotropic-electroconductivity by applying pressure or pressure with heating comprising 0.1 to 15% by volume of electroconductive particles and 99.9 to 85% by volume of an electrically insulating adhesive component, each electroconductive particle comprising a polymeric material as a core material and an electrically conductive this metallic layer coated on almost the whole surface of said core material.

10. An adhesive film according to claim 9, wherein the electroconductive particles have an aspect ratio of 0.05 to 1.0 and an average particle size (diameter) of 0.5 to 300 μm, and the ratio of the thermal expansion coefficient of the adhesive component to that of the core material being 0.5/1 to 10/1 and the ratio of the modulus of elasticity in tension of the adhesive component to that of the core material being 1.2/1 to 0.01/1.

11. An adhesive film according to claim 10, wherein the core material has plastic deformation properties under a pressure or a pressure with heating.

12. An adhesive film according to claim 10, wherein the core material has a thermal expansion coefficient of $20 \times 10^{-5}$ (1/° C.) to $2 \times 10^{-5}$ (1/° C.).

13. An adhesive film according to claim 10, wherein the thickness of the metal thin layer is 0.1 to 1.0 μm and 1/5 to 1/1000 of the average particle size diameter of the electroconductive particles.

14. An adhesive film according to claim 10, wherein the adhesive component has heat-sensitive adhesiveness.

15. An adhesive film according to claim 10, wherein the adhesive component has pressure-sensitive adhesiveness.

16. An adhesive film according to claim 10, wherein the adhesive component is at least one material selected from the group consisting of a heat curing type and a photocuring type.

17. A adhesive film according to claim 10, wherein the adhesive film has a thickness of 1 to 300 μm.

18. A adhesive film according to claim 10, wherein the adhesive film has a total light transmittance of 40% or more.

19. A method for connecting conductors which comprises
interposing an adhesive composition or an adhesive film capable of exhibiting anisotropic-electro-conductivity by applying pressure or pressure with heating comprising 0.1 to 15% by volume of electroconductive particles, each electroconductive particle comprising a polymeric material as a core material and an electrically conductive thin metallic layer coated on almost the whole surface of said core material, said electroconductive particles being dispersed in 99.9 to 85% by volume of an adhesive component, between electrode conductors standing opposite to each other, and
pressing without heating or pressing with heating said conductors so as to make the thickness of the adhesive layer between the conductors in the range of 0.02 to 0.95 of the initial thickness so as to provide electrical connection and mechanical bonding between the conductors.

20. A method according to claim 19, wherein the electroconductive particles have an aspect ratio of 0.05 to 1.0 and an average particle size (diameter) of 0.5 to 300 μm, and a ratio of the thermal expansion coefficient of the adhesive component to that of the core material being 0.5/1 to 10/1 and a ratio of the modulus of elasticity in tension of the adhesive component to that of the core material being 1.2/1 to 0.01/1.

21. A method according to claim 19, wherein a conductor connection portion is crosslinked and cured with heating and/or light irradiation at the time of connection of conductors and/or after connection of conductors.

22. A connected conductor structure comprising conductors standing opposite to each other and connecting materials connecting said conductors electrically, said connecting materials comprising 0.1 to 15% by volume of electroconductive particles and 99.9 to 85% by volume of an electrically insulating adhesive component, each electroconductive particle comprising a polymeric material as a core material and an electrically conductive thin metallic layer coated on almost the whole surface of said core material, and said electroconductive particles being fixed between the conductors standing opposite to each other in a deformed state pressed by the conductors.

23. A connected conductor structure according to claim 22, wherein the electroconductive particles have an aspect ratio of 0.05 to 1.0 and an average particle size (diameter) of 0.5 to 300 μm, and a ratio of the thermal expansion coefficient of the adhesive component to that of the core material being 0.5/1 to 10/1 and a ratio of the modulus of elasticity in tension of the adhesive component to that of the core material being 1.2/1 to 0.01/1.

24. A connected conductor structure according to claim 22, wherein at least one conductor standing opposite to each other is a transparent electroconductive film.

25. A connected conductor structure according to claim 22, wherein said connecting material further comprises highly rigid spacer particles which can control the distance between the conductors to be connected.

* * * * *